(12) United States Patent
Divergilio et al.

(10) Patent No.: US 9,653,253 B2
(45) Date of Patent: May 16, 2017

(54) PLASMA-BASED MATERIAL MODIFICATION USING A PLASMA SOURCE WITH MAGNETIC CONFINEMENT

(71) Applicant: Advanced Ion Beam Technology, Inc., Hsin-Chu (TW)

(72) Inventors: William Divergilio, Green Bay, WI (US); Stephen Savas, Pleasanton, CA (US); Susan Felch, Los Altos Hills, CA (US); Tienyu Sheng, Saratoga, CA (US); Hao Chen, Fremont, CA (US)

(73) Assignee: ADVANCED ION BEAM TECHNOLOGY, INC., Hsin-Chu (TW)

( * ) Notice: Subject to any disclaimer, the term of this patent is extended or adjusted under 35 U.S.C. 154(b) by 371 days.

(21) Appl. No.: 14/201,747

(22) Filed: Mar. 7, 2014

(65) Prior Publication Data

US 2015/0255242 A1 Sep. 10, 2015

(51) Int. Cl.
*H01J 37/317* (2006.01)
*H01J 37/08* (2006.01)
*H01J 37/30* (2006.01)
*H01J 37/32* (2006.01)

(52) U.S. Cl.
CPC .......... *H01J 37/08* (2013.01); *H01J 37/3007* (2013.01); *H01J 37/3171* (2013.01); *H01J 37/3266* (2013.01); *H01J 37/32412* (2013.01); H01J 2237/061 (2013.01); H01J 2237/083 (2013.01)

(58) Field of Classification Search
CPC .......... H01J 37/32009; H01J 37/32055; H01J 37/32357; H01J 37/32366; H01J 37/3174; H05H 1/10–1/14
See application file for complete search history.

(56) References Cited

U.S. PATENT DOCUMENTS

| | | | |
|---|---|---|---|
| 4,447,732 A * | 5/1984 | Leung | H01J 27/08 250/427 |
| 6,083,363 A | 7/2000 | Ashtiani et al. | |
| 6,354,240 B1 * | 3/2002 | DeOrnellas | H01J 37/32082 118/723 E |
| 6,759,807 B2 | 7/2004 | Wåhlin | |
| 7,045,793 B2 | 5/2006 | Wåhlin | |
| 7,291,360 B2 | 11/2007 | Hanawa et al. | |
| 7,716,021 B2 | 5/2010 | Kameyama et al. | |

(Continued)

*Primary Examiner* — Wyatt Stoffa
*Assistant Examiner* — Eliza Osenbaugh-Stewart
(74) *Attorney, Agent, or Firm* — Morrison & Foerster LLP

(57) ABSTRACT

A plasma-based material modification system for material modification of a work piece may include a plasma source chamber coupled to a process chamber. A support structure, configured to support the work piece, may be disposed within the process chamber. The plasma source chamber may include a first plurality of magnets, a second plurality of magnets, and a third plurality of magnets that surround a plasma generation region within the plasma source chamber. The plasma source chamber may be configured to generate a plasma having ions within the plasma generation region. The third plurality of magnets may be configured to confine a majority of electrons of the plasma having energy greater than 10 eV within the plasma generation region while allowing ions from the plasma to pass through the third plurality of magnets into the process chamber for material modification of the work piece.

32 Claims, 8 Drawing Sheets

(56) References Cited

U.S. PATENT DOCUMENTS

| | | | |
|---|---|---|---|
| 7,767,561 B2* | 8/2010 | Hanawa | C23C 14/48 257/E21.057 |
| 8,058,156 B2 | 11/2011 | Hanawa et al. | |
| 8,374,830 B2 | 2/2013 | Kameyama et al. | |
| 2006/0019477 A1* | 1/2006 | Hanawa | C23C 14/48 438/514 |
| 2010/0072401 A1* | 3/2010 | Parrill | H01J 37/20 250/492.21 |
| 2012/0211166 A1* | 8/2012 | Yevtukhov | H01J 27/18 156/345.51 |

* cited by examiner

PLASMA-BASED MATERIAL MODIFICATION USING A PLASMA SOURCE WITH MAGNETIC CONFINEMENT

BACKGROUND

1. Field

The present disclosure relates generally to materials modification and, more specifically, to plasma-based material modification using a plasma source with magnetic confinement.

2. Related Art

Ion-based material modification is an important process used in semiconductor manufacturing. For example, ion-based material modification may be used to amorphize crystalline materials, alloy metals, densify or mix layers of materials, facilitate removal of materials, or introduce impurities into materials. During ion-based material modification, ions are accelerated to bombard the surface of a work piece (e.g., a semiconductor substrate). The ions may be positive or negative ions comprising species or elements that are chemically reactive or inert with respect to the surface of the work piece. The ions may thus modify the physical, chemical, or electrical properties of the surface of the work piece.

Currently, ion-based material modification is performed predominantly using beam-line ion implantation systems. In beam-line ion implantation systems, an ion beam is extracted from an ion source and filtered by mass, charge, and energy through a magnetic analyzer before being accelerated towards a work piece. However, as dictated by Liouville's Theorem, the transport efficiencies of the ion beam decrease with decreasing ion energy. Thus, for low energy processes, beam-line ion implantation systems suffer from low beam currents and thus require long processing times to achieve the required doses. Further, the cross-section of the ion beam is significantly smaller than the area of the work piece where only a fraction of the surface of the work piece may be treated at any given moment. Thus, the ion beam or substrate must be scanned to uniformly treat the entire surface of the work piece. As a result, beam-line ion implantation systems suffer from low throughputs for high dose, low energy implant processes.

Plasma-based material modification systems are an alternative to beam-line ion implantation systems. FIG. 1 depicts an exemplary plasma-based material modification system 100. Plasma-based material modification system 100 comprises plasma source chamber 102 coupled to process chamber 104. Plasma 106, which contains ions, neutral species, and electrons, is generated in plasma source chamber 102. Work piece 118 is supported by support structure 116 within process chamber 104. In this example, plasma-based material modification system 100 has one or more biased grids 120 positioned between plasma 106 and work piece 118 to extract ion beam 112 from plasma 106 and accelerate ion beam 112 to work piece 118. However, in other examples, plasma-based material modification system 100 may not include grids 120. Instead, work piece 118 may be biased at a potential and immersed in plasma 106 by support structure 116. Ions are thus accelerated from plasma 106 to work piece 118 across a plasma sheath formed between plasma 106 and work piece 118. In some cases, work piece 118 may be treated with both ions and neutral species from plasma 106. Currently, most conventional plasma-based material modification systems do not have grids.

Unlike beam-line ion implantation systems, plasma-based material modification systems do not utilize a magnetic analyzer to filter ions by mass or energy. Rather, the work piece is treated with ions directly from the plasma in close proximity. Thus, plasma-based material modification systems can treat a work piece at significantly higher ion currents than beam-line ion implantation systems. In addition, the plasma sources of plasma-based material modification systems may have cross-sectional areas that are larger than the area of the work piece. This enables a large portion of or the entire surface of the work piece to be treated simultaneously without scanning the work piece. Therefore, plasma-based material modification systems offer significantly higher throughputs for high dose, low current processes.

Convention plasma-based material modification systems, however, suffer from poor system reliability and process control. Due to the proximity of the plasma to the process chamber, neutral species from the plasma flow into the process chamber and encounter the work piece. The neutral species cause undesirable parasitic effects such as etching, oxidation, and film deposition on the walls of the process chamber as well as the surface of the work piece. In conventional plasma-based material modification systems, such parasitic effects are substantial and may result in frequent process excursions and low product yields.

BRIEF SUMMARY

In one exemplary embodiment, a plasma-based material modification system for treating a work piece with ions includes a process chamber coupled to a plasma source chamber. A support structure, configured to support the work piece, is disposed within the process chamber. The plasma source chamber includes an end wall disposed at a first end of the plasma source chamber and at least one sidewall defining a chamber interior between the first end and a second end of the plasma source chamber opposite to the first end. The plasma source chamber further includes a first plurality of magnets disposed on the end wall, a second plurality of magnets disposed on the at least one sidewall and surrounding the chamber interior, and a third plurality of magnets extending across the chamber interior. The end wall, the at least one sidewall, and the third plurality of magnets define a plasma generation region within the chamber interior. The plasma source chamber is configured to generate a plasma having ions within the plasma generation region. The third plurality of magnets is configured to confine a majority of electrons of the plasma having energy greater than 10 eV within the plasma generation region while allowing ions from the plasma to pass through the third plurality of magnets into the process chamber for material modification of the work piece.

DETAILED DESCRIPTION

The following description is presented to enable a person of ordinary skill in the art to make and use the various embodiments. Descriptions of specific systems, devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

In an exemplary plasma-based material modification system described below, a plasma source chamber is coupled to a process chamber. A support structure, configured to support a work piece, is disposed within the process chamber. The plasma source chamber is configured to generate a plasma having ions within a plasma generation region of the plasma source chamber. The plasma source chamber includes magnets that surround the plasma generation region and that confine the energetic electrons of the plasma within the plasma generation region. For example, the magnets may confine a majority of electrons of the plasma having energy greater than 10 eV within the plasma generation region. By confining the energetic electrons, the magnets enable the plasma to be stably generated and sustained at pressures below 0.1 Pa. Lower operating pressures are desirable to reduce the concentration of neutral species relative to ions within the plasma source chamber and the process chamber. Lower concentrations of neutral species cause less parasitic etching, oxidation, and film deposition on the surface of the work piece and thus result in superior process control, less device damage and higher device yields. Additionally, lower concentrations of neutral species cause less film deposition on the walls of the plasma source chamber and the process chamber, which reduces particle contamination and increases process repeatability. Accordingly, the plasma-based material modification systems and processes described below may be utilized in semiconductor manufacturing to achieve lower fabrication costs and higher device yields.

1. Plasma-Based Material Modification System Having a Plasma Source with Magnetic Confinement.

Figure 1:
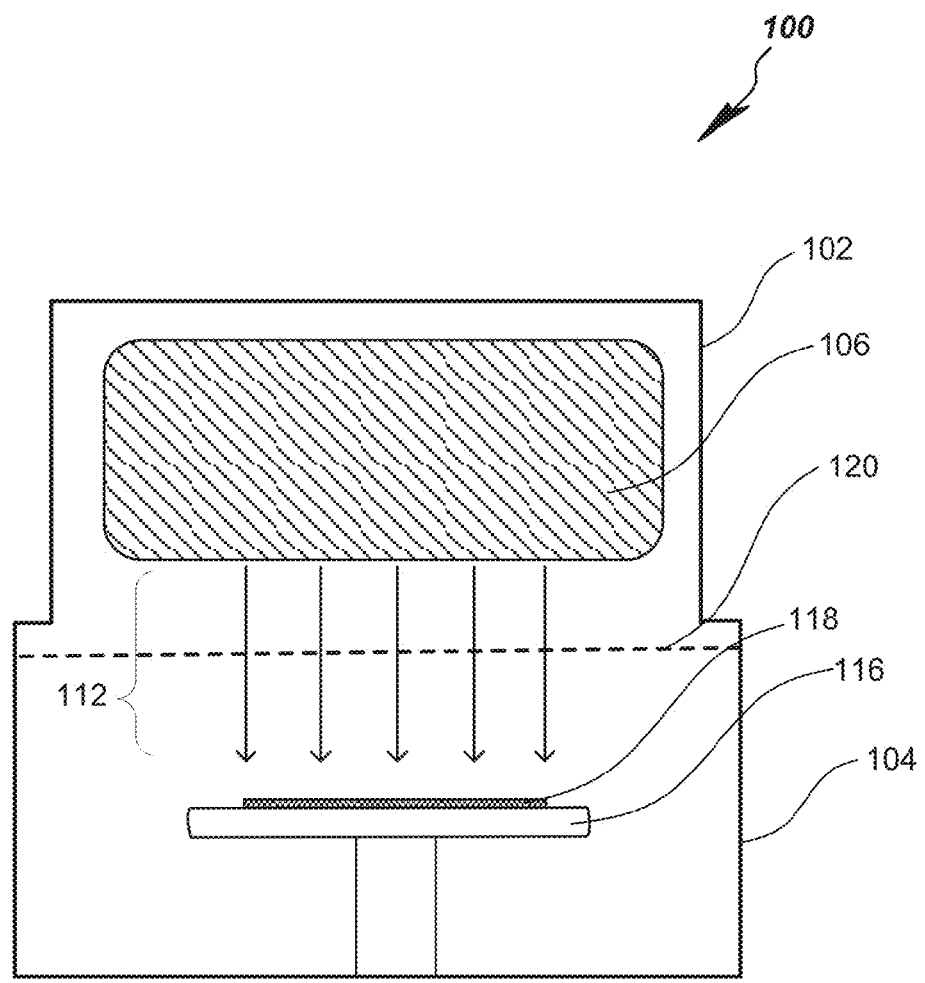
FIG. 1 illustrates an exemplary plasma-based material modification system.
Figure 2:
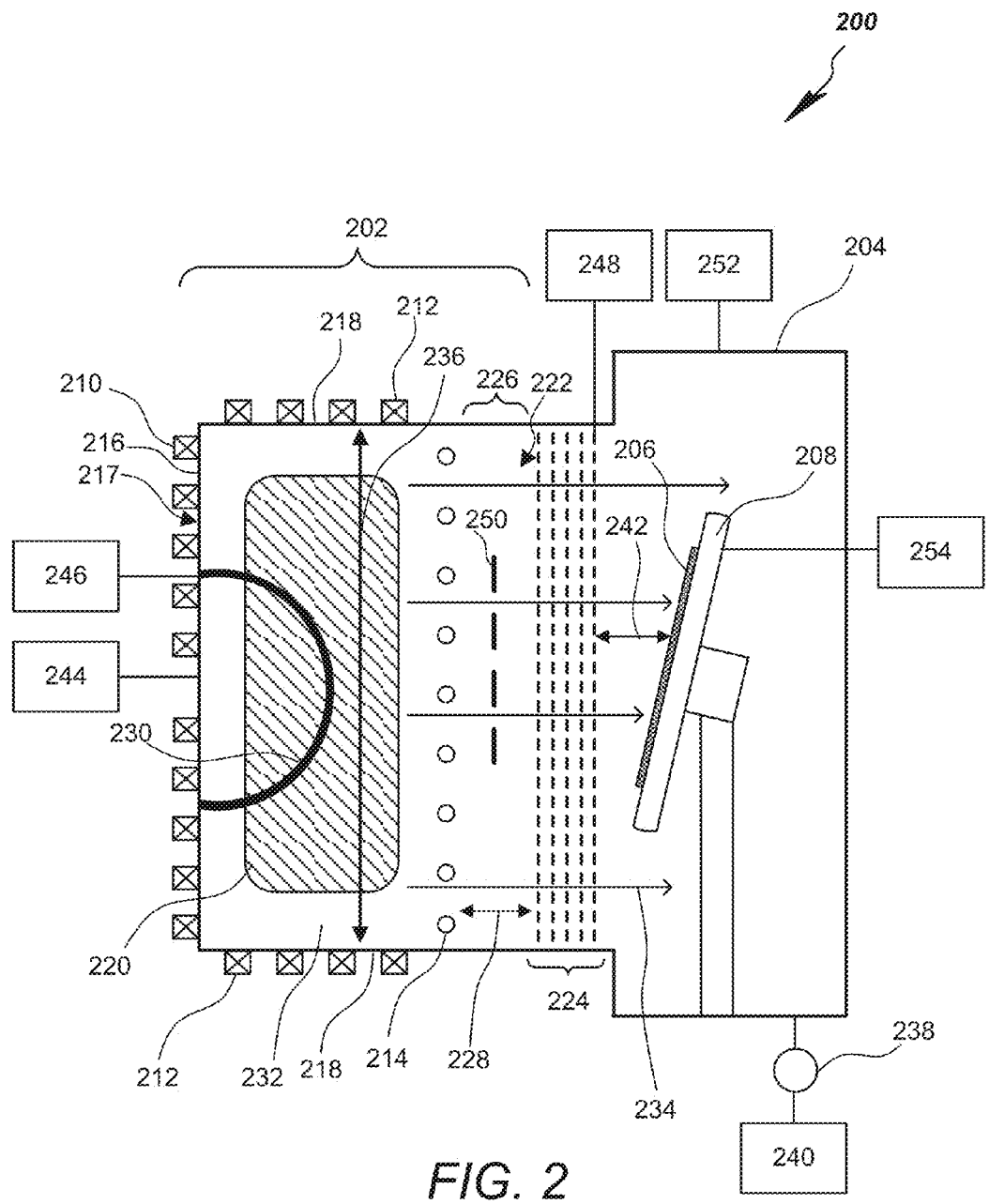
FIG. 2 illustrates a cross-sectional view of an exemplary plasma-based material modification system having a plasma source with a magnetic confinement.

FIG. 2 depicts an exemplary plasma-based material modification system 200 having a plasma source with magnetic confinement. As shown in FIG. 2, plasma-based material modification system 200 includes plasma source chamber 202 coupled to process chamber 204. Plasma source chamber 202 is configured to generate plasma 220 containing ions within plasma generation region 232. Support structure 208 is disposed within process chamber 204 and is configured to support work piece 206. A series of optional grids 224 are positioned between plasma source chamber 202 and support structure 208 to extract ion beam 234 from plasma 220 and accelerate ion beam 234 towards work piece 206, thereby causing material modification of work piece 206.

In the present embodiment, plasma source chamber 202 includes end wall 216 disposed at one end 217 of plasma source chamber 202 and at least one sidewall 218 defining the interior of plasma source chamber 202 between end wall 216 and opposite end 222 of plasma source chamber 202. In this example, sidewall 218 is cylindrical and has a circular cross-section. However, in other cases, sidewall 218 may have a rectangular cross-section.

As shown in FIG. 2, plasma source chamber 202 has an internal diameter 236. Internal diameter 236 defines the cross-sectional area of plasma source chamber 202 and thus at least partially determines the cross-sectional area of plasma 220 and of ion beam 234. Due to ion drift or diffusion losses to sidewall 218, the current density of ions incident to grids 234 may be significantly lower at the outer regions further away from the center axis of ion beam 234 and more proximate to the chamber walls than at the center regions closer to the center axis of ion beam 234. It is thus desirable to implant the entire area of work piece 206 using only the center regions of ion beam 234 nearer the center axis of ion beam 234 where the current density is more uniform. In the present example, internal diameter 236 of plasma source chamber 202 is larger than the diameter of work piece 206. Additionally, the extraction area of grids 224 is larger than the area of work piece 206. Thus, ion beam 234 is generated having a cross-sectional area larger than the area of work piece 206. In one example, internal diameter 236 may be greater than 45 cm. In another example, internal diameter 236 may be between 45 and 60 cm. In a specific example, internal diameter 236 may be 50% to 100% larger than the diameter of work piece 206.

Plasma source chamber 202 includes first set of magnets 210 disposed on end wall 216, second set of magnets 212 disposed on sidewall 218, and third set of magnets 214 extending across the interior of chamber 202. Each magnet of third set of magnets 214 may be housed within a protective tube. End wall 216, sidewall 218, and the third set of magnets 214 define plasma generation region 232 within the interior of plasma source chamber 202. In this example, first set of magnets 210, second set of magnets 212, and third set of magnets 214 are configured to confine energetic electrons of plasma 220 within plasma generation region 232. Energetic electrons may be defined as electrons having energy greater than 10 eV. Particularly, third set of magnets 214 is configured to confine a majority of electrons of plasma 220 having energy greater than 10 eV within plasma generation region 232 while allowing ions from plasma 220 to pass through third set of magnets 214 into process chamber 204 for material modification of work piece 206.

As shown in FIG. 2, plasma-based material modification system 200 may optionally include a series of grids 224 positioned between third set of magnets 214 and support structure 208. One or more grids of grids 224 may be coupled to one or more bias power sources 248 to apply a bias voltage to grids 224. Bias power source 248 may be, for example, a DC power source, a pulsed DC power source, an RF power source, or a combination thereof. In this example, grids 224 are configured to extract ion beam 234 from plasma 220 and accelerate ion beam 234 to a desired energy level towards work piece 206. Additionally, grids 224 may be configured to focus ion beam 234 and thus collimate ion beam 234. It should be recognized that grids 224 may be configured to extract multiple ion beamlets from plasma 220 and that ion beam 234 may thus comprise multiple ion beamlets.

The distance at which grids 224 are positioned from third set of magnets 214 affects the current density uniformity across ion beam 234 and thus the uniformity with which work piece 206 is treated with ions. Positioning grids 224 too close to third set of magnets 214 results in poor current density uniformity across ion beam 234 due to significant ion shadowing effects of third set of magnets 214. However, positioning grids 224 too far from third set of magnets 214 also results in poor current density uniformity across ion beam 234 due to ion drift or diffusion losses to the chamber walls becoming more pronounced as the distance traveled by ions across drift region 226 increases. In the present example, grids 224 are positioned at an optimal distance 228 from third set of magnets 214 to minimize the net effects of ion shadowing by third set of magnets 214 and ion drift or diffusion losses to the chamber walls. In one example, distance 228 is between 0.10D and 0.33D, where D is the internal diameter 236 of plasma source chamber 202. In another example, distance 228 is between 0.2D and 0.3D. In yet another example, distance 228 is between 6 cm and 18 cm.

As shown in FIG. 2, plasma-based material modification system 200 may optionally include absorber 250 for adjusting the current density profile of ion beam 234. Absorber 250 is configured to absorb a fraction of ions flowing from plasma 220 to absorber 250 while allowing the non-absorbed ions to pass through towards support structure 208. In particular, absorber 250 is configured such that the ion transparency of absorber 250 varies across absorber 250. Ion transparency is defined as the percentage of ions incident to absorber 250 that are allowed to pass through absorber 250. Thus, regions of absorber 250 having higher ion transparencies allow a higher percentage of ions to pass through compared to regions of absorber 250 having lower ion transparencies. Absorber 250 may be configured to have regions of lower ion transparency and regions of higher ion transparency. In the present example, the regions of lower ion transparency may be positioned in areas of drift region 226 having higher current densities while the regions of higher ion transparency may be positioned in areas of drift region 226 having lower current densities. Thus, absorber 250 may be configured such that the current density profile of ions exiting absorber 250 is more uniform than the current density profile of ions flowing from plasma 220 to absorber 250. In one example, absorber 250 is configured to have increasing ion transparency from the center to the outer edge of absorber 250.

Absorber 250 may, in some examples, be approximately parallel with respect to end wall 216 and concentric with sidewall 218. In this example, the center of the cross-section of plasma 220 may be aligned with the center axis of plasma source chamber 202. In another example, the center of absorber 250 may be approximately aligned with the center of the cross-section of plasma 220 and the center of work piece 206. In this example, the diameter of absorber 250 may be less than or equal to internal diameter 236 of plasma source chamber 202. For example, the diameter of absorber 250 may be between 0.3D and 1.0D, where D is internal diameter 236 of plasma source chamber 202. In an example, the diameter of absorber 250 may be between 0.5D and 0.8D, where D is internal diameter 236 of plasma source chamber 202.

Absorber 250 may be positioned between the center of plasma 220 and support structure 208. In cases where plasma-based material modification system 200 includes grids 224, absorber 250 may be positioned either between the center of plasma 220 and third set of magnets 214 or between third set of magnets 214 and grids 224. In other cases where plasma-based material modification system 200 does not have grids 224, absorber 250 may be positioned either between the center of plasma 220 and third set of magnets 214 or between third set of magnets 214 and support structure 208. In some cases, absorber 250 may be positioned no closer than 5 cm from support structure 208. It should be recognized that in some examples, plasma-based material modification system 200 may have more than one absorber.

In one example, absorber 250 may be coupled to a ground potential or to a bias voltage source (not shown). Bias voltage source may be, for example, a DC, pulsed DC, or RF power source. The bias voltage source may function to apply a bias potential to absorber 250 to attract or repel ions towards or away from absorber 250. In another example, absorber 250 may be configured to have a floating potential. For example, absorber 250 may be electrically isolated from any power source or power sink and thus the potential of absorber 250 is determined predominately by charging from plasma 220. In some cases, absorber 250 may comprise two or more regions and the two or more regions may be configured to be independently biased. Independently biasing multiple regions of absorber 250 may be advantageous in achieving a more uniform current density profile of ions exiting absorber 250.

Support structure 208 in process chamber 204 is configured to position work piece 206 in the path of ion beam 234 for material modification. Work piece 206 may be a semiconductor substrate (e.g., silicon wafer) used in fabricating IC chips or solar cells. In other cases, work piece 206 may be a glass substrate with thin-film semiconductor layers used in fabricating flat panel displays or thin-film solar cells. Support structure 208 is configured to position work piece 206 at distance 242 from grids 224. Positioning work piece 206 too close to grids 224 may result in poor current density uniformity of ion beam 234 due to the ion shadowing effects of grids 224. Positioning work piece 206 too far from grids 224 may also result in poor current density uniformity of ion beam 234 due to the effects of ion divergence or scattering losses. In one example, distance 242 is between 10 cm and 100 cm. In another example, distance 242 is between 30 cm and 40 cm.

In some embodiments, support structure 208 may be configured to rotate work piece 206. Rotating work piece 206 during plasma-based material modification may be advantageous in improving the uniformity with which work piece 206 is treated with ions. Additionally, support structure 208 may be configured to tilt work piece 206 to control the incidence angle of ion beam 234 with respect to the perpendicular of work piece 206. It should be recognized that support structure 208 may be configured to rotate work piece 206 while tilting work piece 206 at a given angle.

Although in this example, plasma-based material modification system 200 is shown as having optional grids 224, in other cases, plasma-based material modification system 200 may not include grids 224. In such cases, support structure 208 may be configured to apply a bias voltage on work piece 206. For example, support structure may be coupled to bias power source 254 to apply a bias voltage to work piece 206. Biasing work piece 206 functions to accelerate ions from plasma 220 towards work piece 206, thereby treating work piece 206 with ions. Additionally, support structure 208 may be configured to position work piece 206 at an optimal distance from third set of magnets 214 to minimize ion shadowing effects of third set of magnets 214 and ion losses to the chamber walls. In one example, support structure 208 may be configured to position work piece 206 at a distance of 0.10D to 0.33D from third set of magnets 214, where D is internal diameter 236 of plasma source chamber 202. In another example, support structure 208 may be configured to position work piece 206 at a distance of 0.25D to 0.30D from third set of magnets 214.

As described above, first set of magnets 210, second set of magnets 212, and third set of magnets 214 are configured to confine energetic electrons of plasma 220 within plasma generation region 232. Confining energetic electrons of plasma 220 is advantageous because it enables a higher ionization rate and thus lower operating pressures of plasma-based material modification system 200. At lower operating pressures, there is less angular scattering of ion beam 234 due to collisions with background gases, which results in ion beam 234 having a tighter distribution of incidence angles. Additionally, at lower operating pressures, electron temperature is greater, causing ionization rates in plasma 220 to be higher, which reduces the concentration of neutral species relative to ions. Lower concentrations of neutral species generally result in less film deposition on the walls of plasma source chamber 202 and process chamber 204 and thus higher gas efficiency. Particle contamination from film deposits flaking off of the chamber walls is also reduced, which improves system reliability, system availability for production, and device yields. Further, lower concentrations of neutral species reduce parasitic etching, oxidation, and deposition on work piece 206 and thus result in less device damage and higher device yields.

In the present example, first set of magnets 210, second set of magnets 212, and third set of magnets 214 are configured to enable plasma-based material modification system 200 to operate at pressures below 0.1 Pa. Particularly, first set of magnets 210, second set of magnets 212, and third set of magnets 214 may be configured to enable plasma 220 to be stably generated and sustained at a pressure below 0.1 Pa. In another example, first set of magnets 210, second set of magnets 212, and third set of magnets 214 may be configured to enable plasma 220 to be stably generated and sustained at a pressure below 0.02 Pa. In yet another example, first set of magnets 210, second set of magnets 212, and third set of magnets 214 are configured to enable plasma 220 to be stably generated and sustained at a pressure of below 0.1 Pa without the use of an additive gas (e.g., hydrogen, argon, xenon) to help sustain the plasma. Conventional plasma-based material modification systems typically operate at pressures of about 1 Pa. At pressures below 0.1 Pa, conventional plasma-based material modification systems may be unable to generate and sustain a stable plasma and thus material modification cannot be reliably performed. A "stable plasma" or a "stably generated and sustained plasma" is defined as a plasma where the average current density does not vary more than ±5% and in some cases, ±3% during the material modification process. Additionally, the concentration of ions having an atomic or molecular mass greater than 20 AMU in a "stable plasma" or a "stably generated and sustained plasma" does not vary more than 10%.

Figure 3:
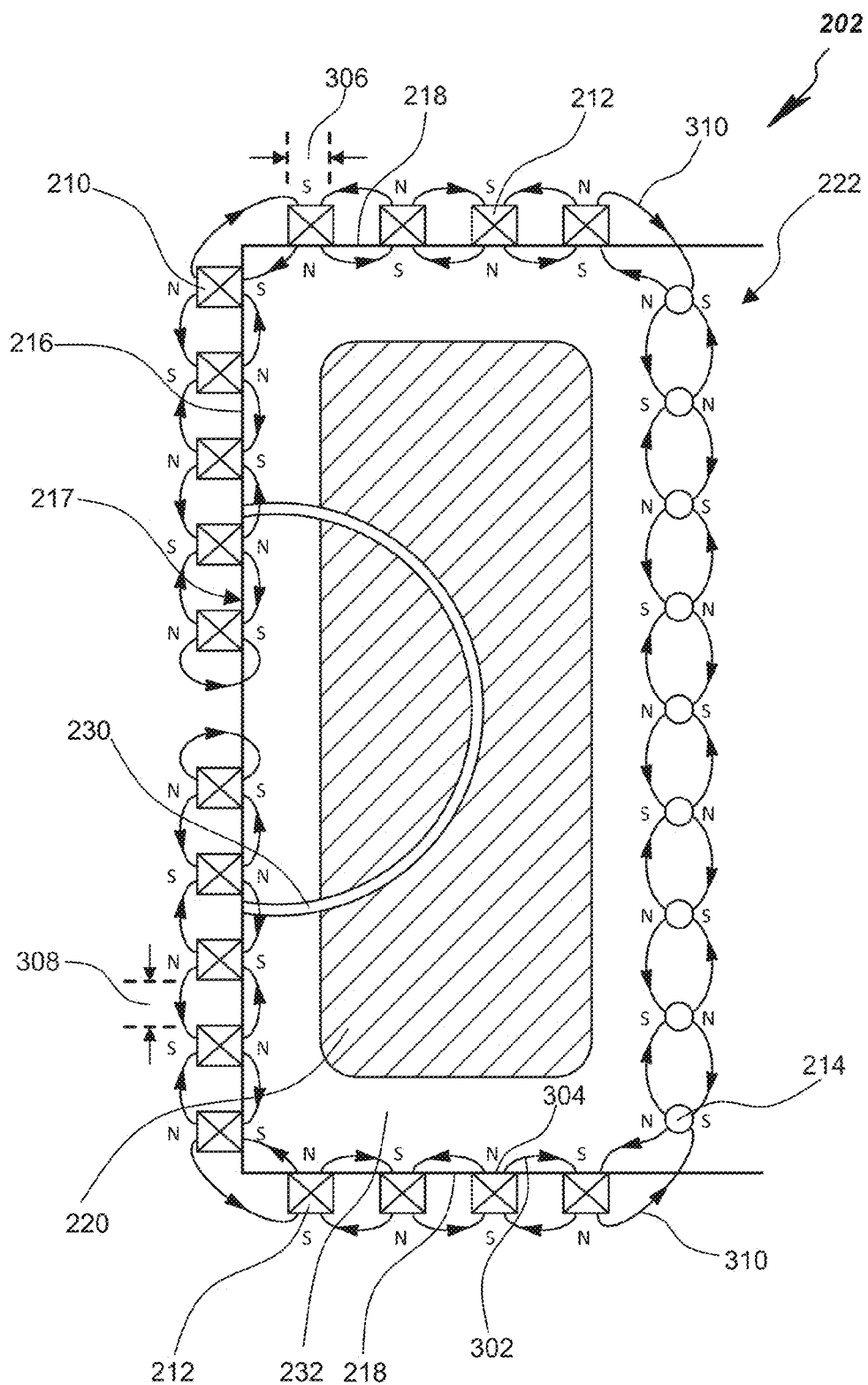
FIG. 3 illustrates a cross-sectional view of an exemplary plasma source chamber.

FIG. 3 depicts a cross-sectional view of an exemplary plasma source chamber 202. As shown in FIG. 3, first set of magnets 210, second set of magnets 212, and third set of magnets 214 are arranged with alternating polarities to produce multi-cusp magnetic fields (illustrated by magnetic field lines 302) that surround plasma generation region 232. The multi-cusp magnetic fields confine a majority of energetic electrons of plasma 220 within plasma generation region 232 by repelling the energetic electrons from end wall 216, sidewall 218, and third set of magnets 214. More specifically, the multi-cusp magnetic fields function to reflect energetic electrons of plasma 220 from end wall 216, sidewall 218, and third set of magnet, thereby enabling most energetic electrons to traverse at least several times across the length and/or diameter of plasma generation region 232 before finally being lost to end wall 216 or sidewall 218. By increasing the path length traveled by energetic electrons within plasma generation region 232, the probability of ionizing an atom or molecule increases. Thus, first set of magnets 210, second set of magnets 212, and third set of magnets enable higher ionization rates in plasma 220 compared to the plasmas generated by conventional plasma sources having no magnetic confinement or only partial magnetic confinement.

Although FIG. 3 depicts magnetic field lines 310 between second set of magnets 212 and third set of magnets 214, it should be recognized that the magnetic fields represented by magnetic field lines 310 may apply only in limited locations where the magnet of second set of magnets 212 adjacent to third set of magnets 214 is approximately parallel to the linear magnets of third set of magnets 214 adjacent to second set of magnets 212. In other locations, the geometry of magnetic field lines between second set of magnets 212 and third set of magnets 214 may be more complex and three-dimensional. Therefore, in general, the magnetic fields near end wall 216 and sidewall 218 may be line cusps while the magnetic fields between second set of magnets 212 and third set of magnets 214 may have more complex geometries.

The strength of the magnetic fields produced by first set of magnets 210 and second set of magnets 212 affects the operation and reliability of plasma source chamber 202 and thus the productivity and cost of ownership of plasma-based material modification system 200. A magnetic field strength that is too high (e.g., greater than 1 kG) at the inner surfaces of end wall 216 or sidewall 218 may cause excessive power densities of plasma 220 incident to the inner surfaces of end wall 216 or sidewall 218 at cusp regions 304 (i.e., regions directly in front of the magnetic pole faces). This may result in non-uniform film deposition on the inner surfaces of end wall 216 and sidewall 218, which may cause film deposits to flake off and contaminate work piece 206. In addition, excessive power densities of plasma 220 may cause material from end wall 216 and sidewall 218 to be sputtered off, which may also contaminate work piece 206. Thus, in the present example, first set of magnets 210 and second set of magnets 212 are not configured to produce a magnetic field strength greater than 1 kG at the inner surfaces of end wall 216 and sidewall 218. It should be recognized that magnets such as samarium cobalt, neodymium iron, or nickel iron boron may be undesirable because such magnets are more likely to produce a magnetic field strength greater than 1 kG at the inner surfaces of end wall 216 and sidewall 218. In one example, first set of magnets 210 and second set of magnets 212 are configured such that the magnetic field strength at the inner surfaces of end wall 216 and sidewall 218 is between 0.1 kG and 1 kG. In another example, first set of magnets 210 and second set of magnets 212 are configured such that the magnetic field strength at the inner surfaces of end wall 216 and sidewall 218 is between 0.3 kG and 0.7 kG. In a specific example, first set of magnets 210 and second set of magnets 212 comprise ceramic permanent magnets (e.g., ferrite magnets) and are configured such that the magnetic field strength at the inner surfaces of end wall 216 and sidewall 218 is between 0.1 kG and 1 kG.

As shown in FIG. 3, each magnet of first set of magnets 210, second set of magnets 212, and third set of magnets 214 has a width 306. In one example, width 306 is between 2 mm and 15 mm. In another example, width 306 may be between 4 mm and 8 mm. Magnets of first set of magnets 210, second set of magnets 212, and third set of magnets 214 may be evenly spaced apart at spacing 308. In one example, spacing 308 between adjacent magnets is between 2 cm and 15 cm. In another example, spacing 308 is between 4 cm and 8 cm.

Third set of magnets 214 may have a magnetic field strength similar to that of first set of magnets 210 and second set of magnets 212. For example, third set of magnets 214 may be configured such that the magnetic field strength is between 0.2 kG and 2 kG at the outer surfaces of the protective tubes housing third set of magnets 214. The magnetic field strength of third set of magnets 214 may be at least partially determined by the width and the spacing of third set of magnets 214. In some cases, third set of magnets 214 may have a smaller width (e.g., 2 to 6 mm) and a larger spacing (e.g., 7 to 15 cm) to reduce ion shadowing caused by third set of magnets 214. In such cases, third set of magnets 214 may have a magnetic field strength greater than that of first set of magnets 210 and second set of magnets 212. In one example, third set of magnets 214 may be configured to have a width of between 4 and 6 mm, a spacing of between 7 and 15 cm and configured such that the magnetic field strength is between 1 kG and 2 kG at the outer surfaces of the protective tubes housing third set of magnets 214.

Although in the present example, first set of magnets 210, second set of magnets 212, and third set of magnets 214 may comprise permanent magnets, it should be recognized that in other cases, any one of or all of first set of magnets 210, second set of magnets 212, and third set of magnets 214 may comprise electromagnets configured to produce multi-cusp magnetic fields similar or identical to that described above in connection with FIG. 3. The electromagnets may include ferromagnetic structures that enable the electromagnets to have effective pole-faces similar to that of first set of magnets 210, second set of magnets 212, and third set of magnets 214 of FIG. 3. In one example, first set of magnets 210 and second set of magnets 212 may comprise electromagnets that are configured to produce a magnetic field strength of between 0.1 kG and 1 kG at the inner surfaces of end wall 216 and sidewall 218. Third set of magnets 214 may comprise electromagnets that are configured to produce a magnetic field strength of between 0.2 kG and 3 kG at the outer surfaces of the protective tubes housing third set of magnets 214.

Figure 4A:
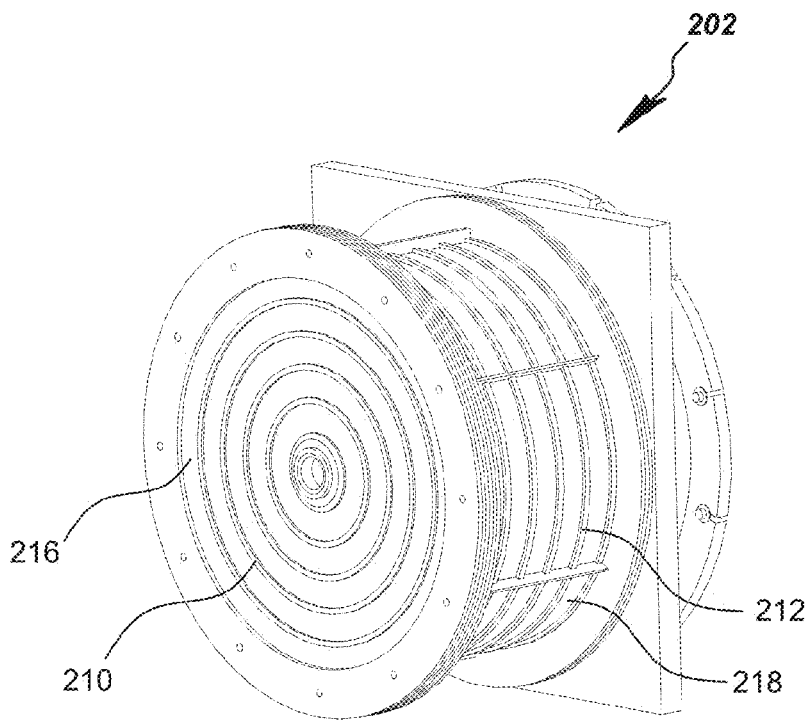
FIGS. 4A and 4B illustrate a perspective view and a cross-sectional perspective view of an exemplary plasma source chamber respectively.
Figure 4B:
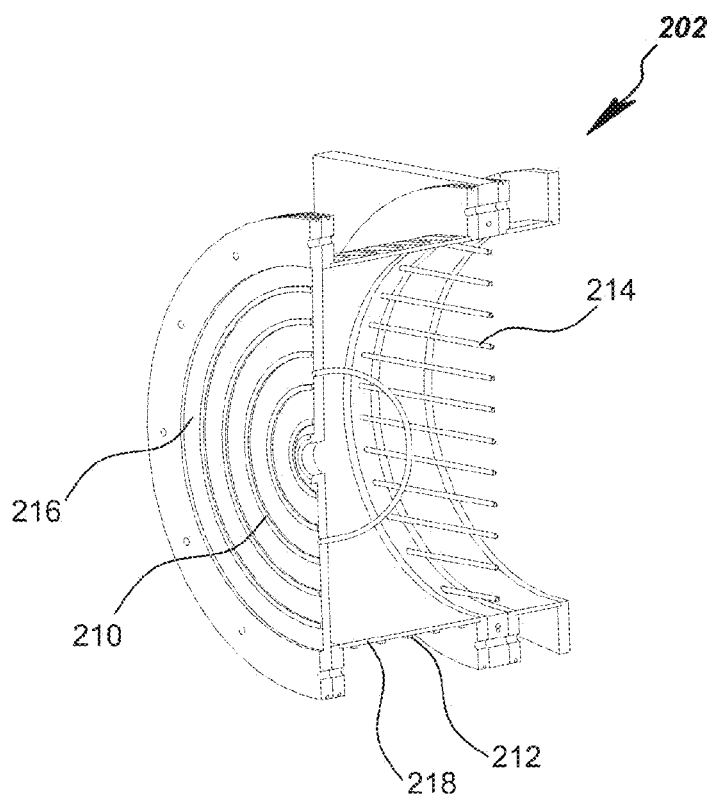

FIGS. 4A and 4B depict a perspective view and a cross-sectional perspective view of plasma source chamber 202 respectively. In the present embodiment, as shown in FIGS. 4A and 4B, first set of magnets 210 and second set of magnets 212 have a circular configuration while third set of magnets 214 has a linear configuration. Referring to FIG. 4A, first set of magnets 210 comprises concentric rings of permanent magnets distributed along end wall 216. Second set of magnets 212 comprises rows of permanent magnets that extend around the circumference of sidewall 218. Referring to FIG. 4B, third set of magnets 214 comprises linear magnets extending across the interior of plasma source chamber 202 and distributed approximately evenly across the interior cross-sectional area of plasma source chamber 202. The linear magnets of third set of magnets 214 may be aligned with respect to a plane that is approximately parallel to end wall 216. Additionally, the linear magnets of third set of magnets 214 may or may not be aligned with respect the magnets of first set of magnets 210 and second set of magnets 212. As described above, each magnet of third set of magnets 214 may be housed within a protective tube to prevent damage caused by direct exposure to plasma 220. Additionally, plasma source chamber 202 may be configured to flow cooling fluid (e.g., water, ethylene glycol, etc.) through internal channels disposed between each magnet and the inner surface of the corresponding protective tube to keep third set of magnets 214 cool.

In the present example, as described above with reference to FIG. 3, the linear magnets of third set of magnets 214 are configured to have alternating polarities such that the pole-face field direction of each linear magnet is approximately perpendicular to end wall 216. However, in other examples, the linear magnets of third set of magnets 214 may be configured to have alternating polarities such that the pole-face field direction of each linear magnet is approximately parallel to end wall 216.

Although in the present example, first set of magnets 210 and second set of magnets 212 each have a circular configuration while third set of magnets 214 has a linear configuration, it should be recognized that first set of magnets 210, second set of magnets 212, and third set of magnets 214 may have alternative configurations. For example, in some cases first set of magnets 210 and/or second set of magnets 212 may have a linear configuration. Additionally, third set of magnets 214 may have a circular configuration.

Figure 5A:
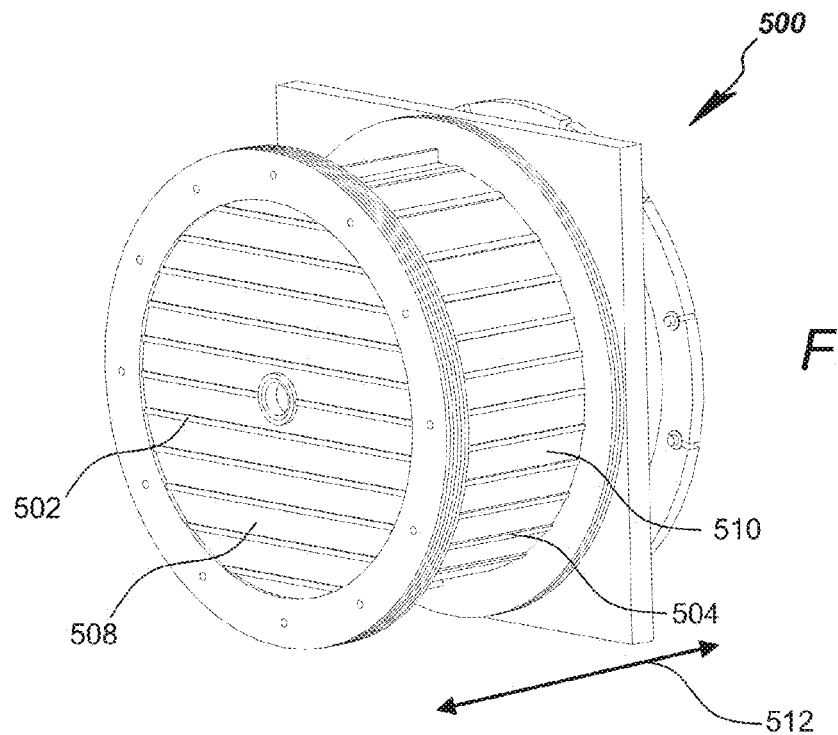
FIGS. 5A and 5B illustrate a perspective view and a cross-sectional perspective view of an exemplary plasma source chamber respectively.
Figure 5B:
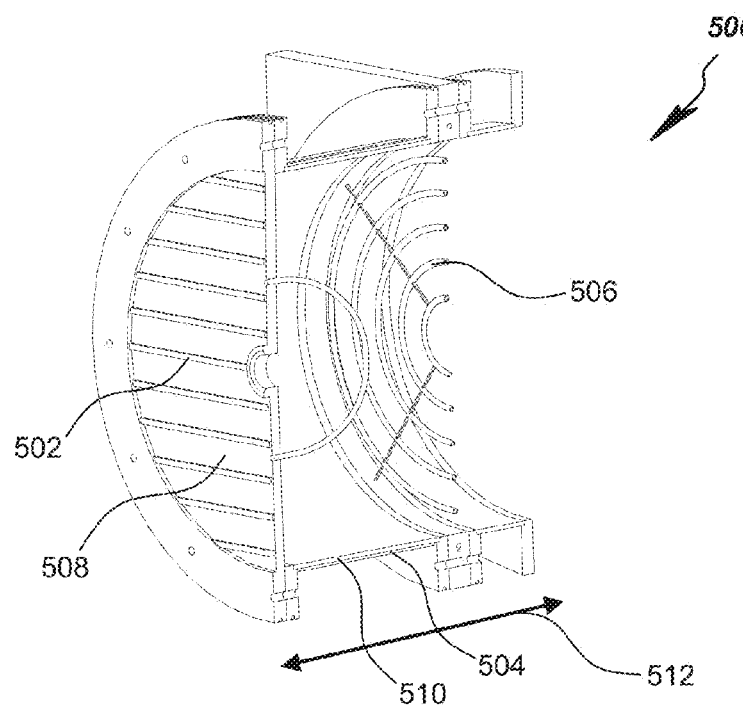

FIGS. 5A and 5B depict a perspective view and a cross-sectional perspective view of plasma source chamber 500 having an alternative configuration of first set of magnets, second set of magnets, and third set of magnets. As shown in FIGS. 5A and 5B, first set of magnets 502 and second set of magnets 504 have linear configurations while third set of magnets 506 has a circular configuration. With reference to FIG. 5A, first set of magnets 502 and second set of magnets 504 comprise linear magnets arranged with alternating polarities and distributed along end wall 508 and sidewall 510 respectively. The linear magnets of second set of magnets 504 may be positioned parallel to length 512 of plasma source chamber 500. With reference to FIG. 5B, third set of magnets 506 comprises concentric rings of permanent magnets arrange with alternating polarities. Similar to third set of magnets 214 of FIG. 3, the pole-face field direction of each magnet of third set of magnets 506 may be parallel or perpendicular to end wall 216. Additionally, first set of magnets 502 and second set of magnets 504 may be configured such that the magnetic field strength at the inner surfaces of the end wall and the sidewall are similar or identical to that of first set of magnets 210 and second set of magnets 212 described above with reference to FIG. 3. Third set of magnets 506 may be configured such that the magnetic field strength at the outer surfaces of the protective tubes housing third set of magnets 506 are similar or identical to that of third set of magnets 214 described above with reference to FIG. 3.

Figure 6:
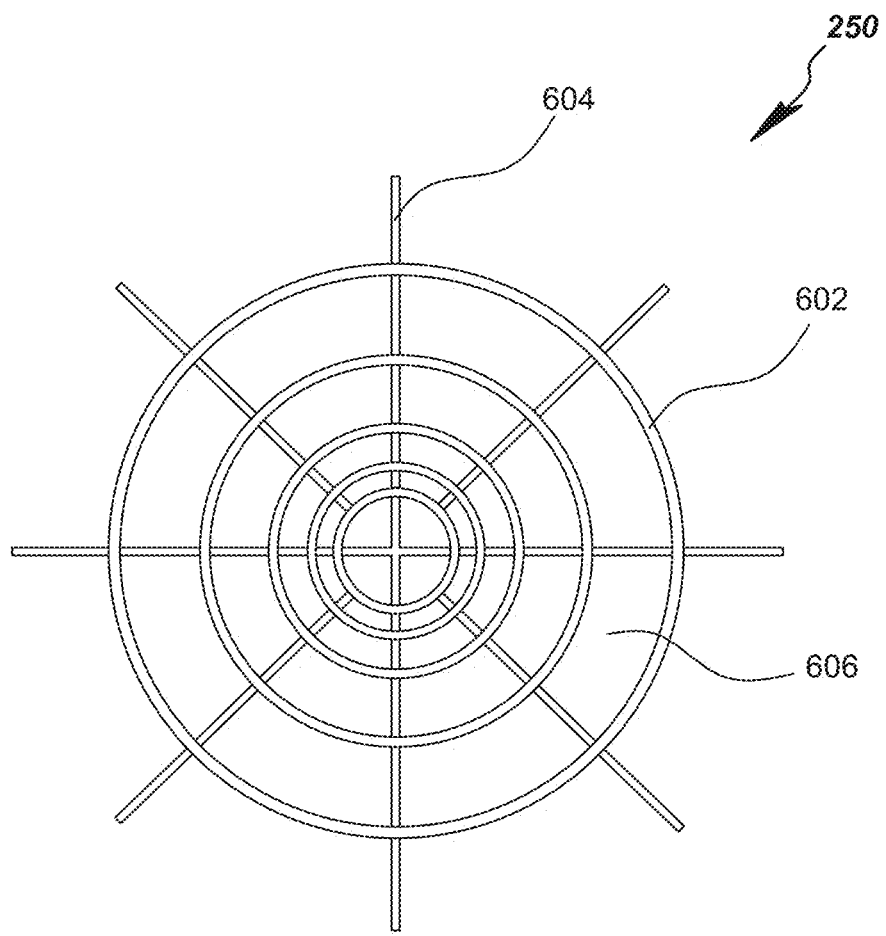
FIG. 6 illustrates an exemplary absorber of a plasma-based material modification system.

FIG. 6 depicts a front view of an exemplary absorber 250 that may be used in plasma-based material modification system 200 of FIG. 2 to adjust the current density profile of ion beam 234. As shown in FIG. 6, absorber 250 comprises a pattern of ion-absorbing material. Openings 606 are disposed between the ion-absorbing material. The ion-absorbing material may be a conductive material, such as, a metal. In some cases, absorber 250 may include an outer coating (e.g., semiconductor material) to prevent impurities from sputtering off and contaminating work piece 206.

In the present example, the pattern of ion-absorbing material comprises a pattern of concentric rings 602 attached to linear rods 604. Linear rods 604 are arranged symmetrically with respect to the center of absorber 250. Two of linear rods 604 form a cross pattern in the center ring of absorber 250. Concentric rings 602 and linear rods 604 are configured to absorb ions that are incident to concentric rings 602 and linear rods 604 while allowing ions to pass through the openings 606 between concentric rings 602 and linear rods. It should be recognized that absorber 250 may include fewer or additional concentric rings 602 or linear rods 604 to either increase or decrease ion transparency.

As shown in FIG. 6, the spacing between adjacent rings 602 and thus the size of the openings 606 increases with distance from the center of absorber 250. Accordingly, the ion transparency of absorber 250 increases from the center of absorber 250 to the edge of absorber 250 where regions closer to the center of absorber 250 have a lower ion transparency than regions further from the center of absorber 250. With reference to FIG. 2, absorber 250 may function to compensate for non-uniformities in the current density profile of ions flowing from plasma 220. Due to ion losses to the chamber walls, ions flowing from plasma 220 may have higher current densities at the center regions closer to the center axis of plasma source chamber 202 than at the outer regions further from the center axis of plasma source chamber 202 and closer to the chamber walls. Absorber 250 may thus be used to reduce the current density at the center regions relative to the outer regions to achieve a more uniform current density profile. Thus, the current density profile of ions exiting absorber 250 may be more uniform than the current density profile of ions flowing from plasma 220 to absorber 250.

Figure 7A:
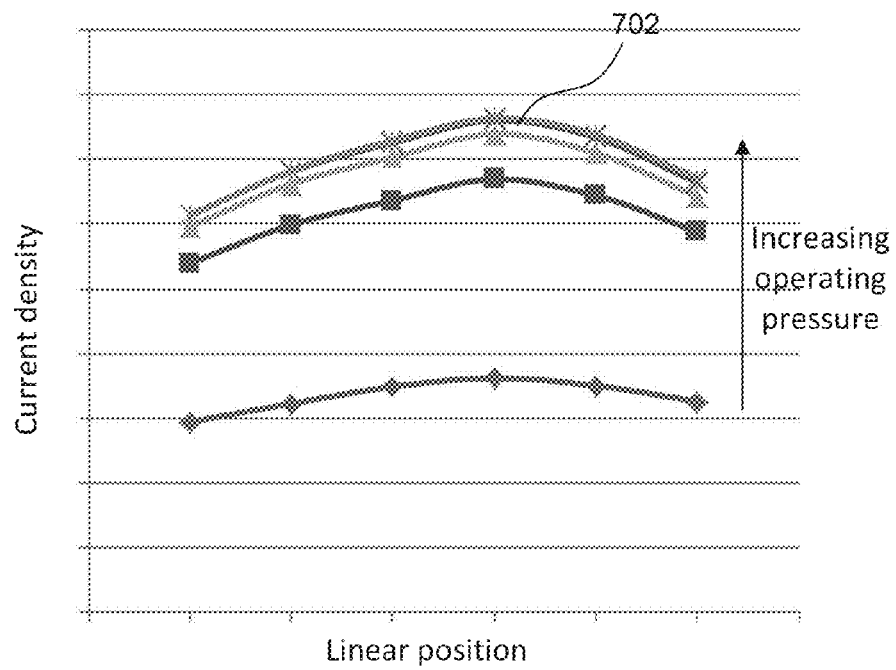
FIG. 7A illustrates the current density profiles of ions flowing through the drift region of an exemplary plasma-based material modification system without an absorber at various operating pressures.
Figure 7B:
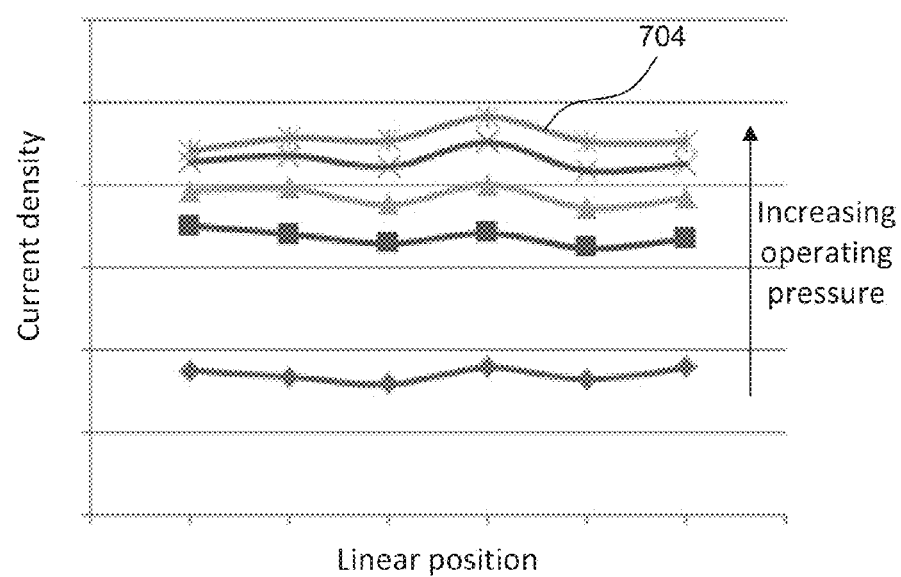
FIG. 7B illustrates the current density profiles of ions exiting an absorber in the drift region of an exemplary plasma-based material modification system at various operating pressures.

FIG. 7A illustrates current density profiles 702 of ions flowing through the drift region of an exemplary plasma-based material modification system without an absorber at various operating pressures. FIG. 7B illustrates current density profiles 704 of ions exiting an absorber in the drift region of an exemplary plasma-based material modification system at various operating pressures. When no absorber is used, current density profiles 702 (FIG. 7A) are non-uniform where the current densities of ions at the center of the cross-section of the drift region are greater than at the edge. However, when an absorber is used, the current density profiles 704 (FIG. 7B) are more uniform where the current densities of ions exiting the absorber at the center of the cross-section of the drift region are more comparable to that at the edge. Accordingly, operating a plasma-based material modification system with an absorber is advantageous in achieving a more uniform current density profile of ions treating the work piece.

It should be recognized that absorber 250 may have other configurations for adjusting the current density profile in various ways. In general, absorber 250 may be configured such that the ion transparency of one region of absorber 250 is different from the ion transparency of another region of absorber 250. Ion transparency of a region is at least partially determined by the ratio of the area occupied by openings in the region to the area occupied by the pattern of ion-absorbing material in the region. Regions of absorber 250 having a higher ratio are thus more transparent to ions than regions of absorber 250 having a lower ratio. For example, the ion transparency of a region of absorber 250 may be increased by increasing the size and density of openings 606 in the region.

Unlike grids 224, the ratio of total area occupied by openings in absorber 250 to total area occupied by the pattern of ion-absorbing material in absorber 250 is greater than 2:1. Having a ratio that is less than 2:1 would be undesirable because absorber 250 would absorb too large of a fraction of ions flowing from plasma 220, thereby causing low ion current densities at work piece 206. In one example, absorber 250 may have a ratio of total area occupied by openings to total area occupied by the patterned of ion-absorbing material that is between 2:1 and 20:1. In another example, the ratio may be between 5:1 and 15:1.

Although absorber 250 is described in conjunction with plasma-based material modification system 200, it should be recognized that absorber 250 may be used to adjust the current density profile of any plasma-based material modification system. For example, absorber 250 may be implemented in a conventional plasma-based material modification system not having a plasma source with magnetic confinement.

In the present example, with reference back to FIG. 2, grids 224 comprise a series of five grids 224. Each grid of grids 224 is positioned in parallel relation to each of the other grids. In this example, grids 224 are positioned substantially parallel to end wall 216. However, in other cases, grids 224 may be tilted at an angle with respect to end wall 216. Grids 224 may occupy the internal cross-sectional area of the region between plasma source chamber 202 and process chamber 204. In this example, grids 224 have a diameter that is approximately equal to internal diameter 236 of plasma source chamber 202. However, in other cases, grids 224 may have a diameter that differs from internal diameter 236 of plasma source chamber 202. For example, the region between plasma source chamber 202 and process chamber 204 may have an internal cross-sectional area that is greater than that of plasma source chamber 202. In such an example, the diameter of grids 224 may be greater than internal diameter 236. Having a larger internal cross-sectional area in the region between plasma source chamber 202 and process chamber 204 may be advantageous in reducing ion losses to the sidewalls and thus improving the uniformity of the current density profile of ion beam 234 exiting grids 224.

Each grid of grids 224 includes an array of apertures to allow ions to pass through. The apertures of each grid are substantially aligned with the apertures of each of the other grids. Ion beam 234 may thus pass through the aligned apertures of grids 224 in the form of multiple small diameter ion beams (i.e. beamlets). In some cases, the beamlets may diverge after exiting grids 224 and merge to form a single and uniform ion beam prior to encountering work piece 206. The profile of ion beam 234 exiting grids 224 is at least partially determined by the profile of the beamlets exiting each grid of grids 224. The profile of the beamlets exiting each grid is at least partially determined by the size and alignment of the apertures of each grid, the spacing and thickness of each grid, and the bias applied to each grid. It should be recognized that each of these variables may be adjusted to achieve the desired profile of ion beam 234. In the present example, the apertures of each grid may have a diameter of between 1 mm and 10 mm, the spacing between adjacent grids 224 may be between 2 mm and 10 mm apart, and the thickness of each grid may be between 1 mm and 10 mm.

Although in this example, grids 224 includes five grids, it should be recognized that in other examples, grids 224 may include more or less grids to achieve the desired ion beam current, energy, and profile. For example, grids 224 may include between 2 and 6 grids. In some examples, grids 224 may include 3 or 4 grids. Having 4 or 5 grids may be advantageous over having 3 or fewer grids because it enables greater flexibility in focusing and adjusting the profile of ion beam 234.

As previously described in connection with FIG. 2, plasma source chamber 202 is configured to generate plasma 220 having ions within plasma generation region 232. Plasma 220 may be generated by supplying a process gas into plasma source chamber 202 and introducing power (e.g., electrical power or AC electric power) from a power source (e.g., electrical power source or AC electrical power source) into plasma source chamber 202 to ionize and dissociate the process gas. The process gas may contain one or more elements for modifying the physical, chemical, or electrical properties of work piece 206. In this example, plasma source chamber 202 is coupled to gas source 244 to supply the process gas into plasma source chamber 202. Power source 246 is coupled to one or more antennas 230 through an impedance matching network (not shown) to introduce LF, RF, or VHF power into plasma source chamber 202 via the one or more antennas 230. The introduced LF, RF, or VHF power energizes electrons in plasma generation region 232, which in turn ionize and dissociate the process gas, thereby forming plasma 220 in plasma generation region 232. Antenna 230 is disposed within plasma source chamber 202 and is configured to enable plasma 220 to be stably generated and sustained at pressures below 0.1 Pa without the use of an additive gas (e.g., hydrogen, argon, etc.).

Although in this example, plasma source chamber 202 is configured to supply LF, RF, or VHF power through antenna 230 to form plasma 220, it should be recognized that other configurations may be possible to supply power into plasma source chamber 202. For example, in place of antenna 230, induction coils may be disposed around the outside of plasma source chamber 202. In such an example, power source 246 may be coupled to the induction coils to supply power (e.g., electrical power or AC electrical power) into plasma source chamber 202. In another example, plasma source chamber 202 may be configured to supply UHF or microwave power into plasma source chamber 202 to form plasma 220. In yet another example, plasma source chamber 202 may be configured to generate energetic thermionic electrons in plasma generation region 232 to form plasma 220. For example, a tungsten filament may be heated in plasma generation region 232 to generate energetic thermionic electrons.

Process chamber 204 may be coupled, via throttle valve 238, to high-speed vacuum pump 240. For example, high-speed vacuum pump 240 may be configured to pump at a rate of at least several hundred liters per second. Throttle valve 238 and high-speed vacuum pump 240 may be configured to maintain an operating pressure of below 0.1 Pa (and in some cases below 0.02 Pa) in plasma source chamber 202 and process chamber 204. Additionally, plasma-based material modification system may include one or more cryo-panels disposed within process chamber. The one or more cryo-panels may serve to capture residual gases or organic vapors to achieve ultra-low operating pressures. In one example, the one or more cryo-panels may be configured to maintaining a pressure of below 0.02 Pa in plasma source chamber 202 and process chamber 204.

Additionally, electron source 252 may be coupled to process chamber 204 to supply low-energy electrons between grids 224 and work piece 206 to neutralize the space charge of ion beam 234. In one example, electron source 252 is a plasma source for generating low energy electrons. In another example, electron source 252 may be an electron flood gun. Neutralizing the space charge of ion beam 234 is desirable to reduce the spread of ion beam 234 that is caused by space charge effects. In addition, electron source 252 may serve to prevent excessive localized charging (e.g., >10 V) on work piece 206 which may cause undesirable damage such as threshold voltage shifts or gate dielectric damage to devices on work piece 206.

2. Plasma-Based Material Modification Process

Figure 8:
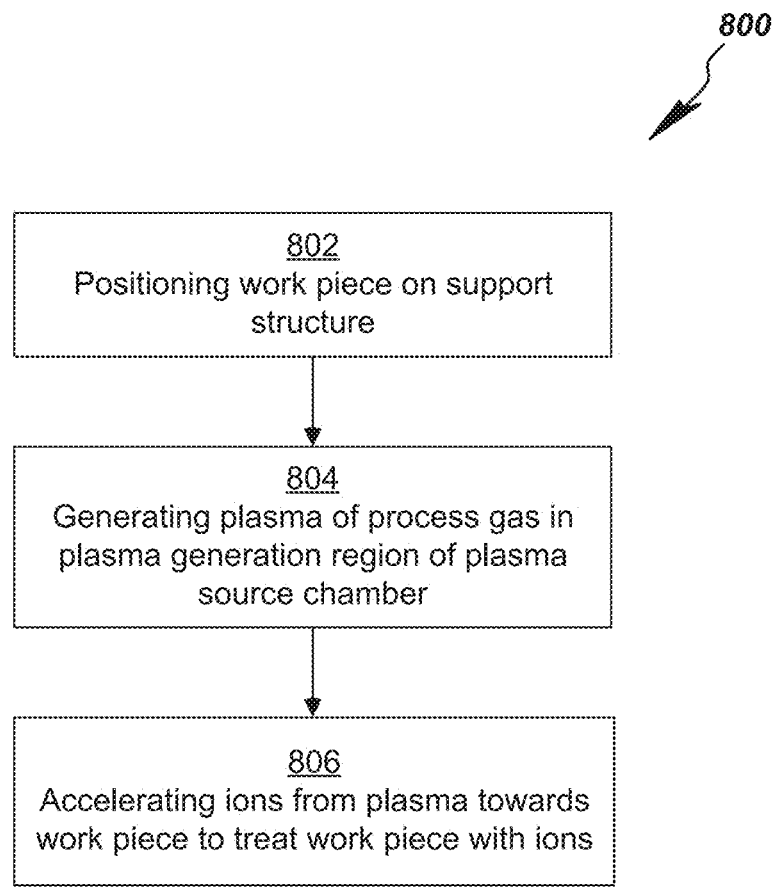
FIG. 8 illustrates an exemplary process for plasma-based material modification using a plasma-based material modification system having a plasma source with magnetic confinement.

FIG. 8 depicts an exemplary plasma-based material modification process 800. Process 800 may be performed using a plasma-based material modification system having a plasma source with magnetic confinement. In the present example, with reference to FIG. 2, process 800 is performed using plasma-based material modification system 200. However, it should be recognized that process 800 may be performed using other plasma-based material modification systems. Process 800 is described below with simultaneous reference to FIG. 2 and FIG. 8.

Process 800 may be performed at a low pressure where the pressures in the plasma source chamber 202, the drift region 226, and the process chamber 204 are regulated to below 0.1 Pa or below 0.02 Pa. The pressure may be regulated by controlling throttle valve 238 and high-speed vacuum pump 240. As described above, low operating pressures are desirable to achieve higher system reliability, superior process control, and higher device yields.

At block 802 of process 800, work piece 206 is positioned on support structure 208. In one example, work piece 206 may be a semiconductor substrate (e.g., silicon, germanium, gallium arsenide, etc.) with semiconductor devices at least partially formed thereon. In another example, work piece 206 may be a glass substrate with thin film semiconductor devices at least partial formed thereon.

At block 804 of process 800, plasma 220 is generated in plasma generation region 232 of plasma source chamber 202. Plasma 220 contains ions, neutral species, and electrons. In one example, the fraction of electrons of plasma 220 having energy greater than 10 eV may be greater than that of a plasma generated by a plasma source having no magnetic confinement or only partial magnetic confinement. Plasma 220 may be generated by supplying a process gas from gas source 244 into plasma source chamber 202 and introducing power from a power source into plasma source chamber 202 to ionize and dissociate the process gas. It should be recognized that multiple process gases may be supplied into plasma source chamber 202 to generate plasma 220.

A process gas may be any pre-cursor gas containing one or more elements for modifying the physical, chemical, or electrical properties of work piece 206. For example, the process gas may be a boron, phosphorous, or arsenic containing gas (e.g., arsine, phosphine, diborane, arsenic or phosphorus vapor, boron trifluoride, etc.) to introduce charge carriers (e.g., holes or electrons) into work piece 206. Further, the process gas may include an inert gas such as helium or an additive gas such as hydrogen. In some examples, the process gas may contain elements such as carbon, nitrogen, noble gas or a halogen for modifying the intrinsic stress or other mechanical or chemical properties of the surface of work piece 206. Such process gases may also be used for modifying the work function at layer interfaces of device structures on work piece 206. In other examples, the process gas may contain elements such as silicon, germanium, aluminum, a chalcogen, or a lanthanide for modifying the Schottky barrier height at layer interfaces of device structures on work piece 206.

The process gas may be ionized and dissociated by supplying power (e.g., electrical power or AC electrical power) from power source 246 (e.g., electrical power source or AC electrical power source) via antenna 230 into plasma source chamber 202. In this example, LF, RF, or VHF power is supplied from power source 236 via antenna 230 into plasma source chamber 202 to generate high energy electrons in plasma generation region 232. The high energy electrons ionize and dissociate the process gas to form plasma 220. In one example, power source 246 may supply 200 W to 10 kW of RF power at a frequency between 100 kHz and 100 MHz via antenna 230 to ionize and dissociate the process gas in plasma source chamber 202. It should be recognized that other forms of power may be supplied to ionize and dissociate the process gas. For example, as described above, UHF or microwave power may be supplied instead of LF, RF, or VHF power. In another example, a heated filament in the plasma generation region 232 may be used to ionize and dissociate the process gas.

In one example, plasma 220 may be generated in plasma source chamber 202 at a pressure below 0.1 Pa. In another example, plasma 220 may be generated at below 0.02 Pa. Generating plasma 220 at a lower pressure is advantageous because it increases the average energy of electrons (i.e., electron temperature) in plasma 220, which, within a range of energies, exponentially increases the ionization rate per electron within plasma 220. A greater ionization rate results in a higher concentration of ions and a lower concentration of neutral species within plasma 220. For example, the ratio of neutral species to ions in plasma 220 may be at least an order of magnitude lower when plasma 220 is generated at the same power density at a pressure below 0.1 Pa than when plasma 220 is generate at a pressure of 1 Pa. Lower concentrations of neutral species in plasma 220 are advantageous in reducing the flux of neutral species to work piece 206. Further, a greater ionization rate enables process 800 to be more gas efficient since less process gas is needed to generate ion beam 234 and treat work piece 206.

Plasma 220 is generated within plasma generation region 232 of plasma source chamber 202 where a majority of electrons having energy greater than 10 eV are confined by first set of magnets 210, second set of magnets 212, and third set of magnets 214. As described above in connection with FIG. 3, first set of magnets 210, second set of magnets 212, and third set of magnets 214 produce multi-cusp magnetic fields that surround the plasma generation region 232. The multi-cusp magnetic fields repel energetic electrons from end wall 216, sidewall 218, and third set of magnets 214, thereby increasing the efficiency at which plasma 220 is generated within plasma generation region 232 at distances greater than 5 cm from end wall 216 and sidewall 218. By confining energetic electrons in plasma 220, plasma 220 may be stably generated and sustained at pressures below 0.1 Pa or 0.02 Pa. In the absence of first set of magnets 210, second set of magnets 212, and third set of magnets 214, plasma 220 may become unstable or unsustainable at pressures below 0.1 Pa and thus may be unsuitable for performing material modification for mass production.

Plasma 220 may be generated in plasma source chamber 202 having a cross-sectional area that is significantly greater than the area of work piece 206. In one example, internal diameter 236 of plasma source chamber 202 may be greater than 45 cm. In another example, internal diameter 236 may be 50% to 100% larger than the diameter of work piece 206. As previously described, a larger internal diameter 236 is advantageous in enabling work piece 206 to be treated with ions from only the center regions of ion beam 234 where the current density profile is more uniform.

At block 806 of process 800, ions are accelerated from plasma 220 towards work piece 206 to treat work piece 206 with ions. In one example, block 806 may be performed by applying one or more bias voltages to one or more grids of grids 224 to accelerate ions from plasma 220 to work piece 206. The one or more bias voltages may be a DC, pulsed DC, RF bias voltage, or a combination thereof. In such an example, plasma-based material modification system 200 includes grids 224 disposed between third set of magnets 214 and support structure 208. As described above, grids 224 are positioned at an optimal distance 228 from third set of magnets 214 to achieve a more uniform current density profile to treat work piece 206. In one example, distance 228 is between 0.10D and 0.33D, where D is internal diameter 236 of plasma source chamber 202. In another example, distance 228 is between 0.2D and 0.30D. In yet another example, distance 228 is between 6 cm and 18 cm.

The one or more bias voltages may be applied to the one or more grids of grids 224 using one or more bias power sources 248. Bias power source 248 may be a DC power source, a pulsed DC power source, or an RF power source. Applying the one or more bias voltages to the one or more grids of grids 224 extracts ion beam 234 from plasma 220 and accelerates ion beam 234 through grids 224 to work piece 206. Additionally, grids 224 may focus or collimate ion beam 234. For example, ion beam 234 may comprise multiple beamlets as it passes through grids 224. Applying one or more bias voltages on grids 224 may focus and collimate the beamlets of ion beam 234.

In the present example, grids 224 include 5 grids. For convenience, the grids will be referred to in sequential order with the grid closest to plasma source chamber 202 being referred to as the "first grid" and the grid closest to process chamber 204 being referred to as the "fifth grid." In one example, the first grid may function as an extraction grid and be biased at approximately ±100 V with respect to the potential of end wall 216 and sidewall 218 of plasma source chamber 202. The second grid may be an acceleration grid that is biased at a negative extraction voltage of up to −20 kV with respect to the first grid to extract ion beam 234 from plasma 220. It should be appreciated that the extraction voltage applied to the second grid with respect to the first grid must be approximately in accordance with the Child-Langmuir law, where the current density extracted is a function of the potential difference between the grids and the distance between the grids. The fifth grid may be biased at approximately ground while the fourth grid may be biased at a negative voltage (e.g., −200 V to 0 V) relative to the fifth grid to suppress electron back-acceleration into plasma source chamber 202. The bias voltage applied to the third and the fourth grid may be selected to achieve the desired energy and profile of ion beam 234.

It should be recognized that any number of grids may be used to extract, accelerate, and focus ion beam 234. Additionally, it should be appreciated that using four or more grids offers greater flexibility in achieving the desire energy and profile of ion beam 234.

In some examples, process 800 may be performed using plasma-based material modification system 200 without grids 224. In such examples, block 806 may be performed by applying a bias voltage to work piece 206 to accelerate ions from plasma 220 to work piece 206. The bias voltage may be applied to work piece 206 via support structure 208 using bias power source 254. Bias power source 254 may be, for example, a DC power source, a pulsed DC power source, or an RF power source. Applying a bias voltage to work piece 206 accelerates ions from plasma 220 to work piece 206. A plasma sheath may form between plasma 220 and work piece 206 where ions from plasma 220 accelerate across the plasma sheath to work piece 206. Further, at low operating pressures, there is less charge exchange in the plasma sheath and thus the energy distribution of ions reaching work piece 206 is tighter.

To achieve uniform treatment of ions across work piece 206, work piece 206 may be positioned by support structure 208 at an optimal distance from third set of magnets 214. Positioning work piece 206 too close to third set of magnets 214 may result in non-uniform ion current density at work piece 206 due to ion shadowing from third set of magnets 214. However, positioning work piece 206 too far from grids 224 may also result in non-uniform ion current density at work piece 206 due to ion losses to the sidewalls. In one example, work piece 206 may be positioned by support structure 208 at a distance between 0.10D and 0.33D from third set of magnets 214, where D is internal diameter 236 of plasma source chamber 202. In another example, work piece 206 may be positioned by support structure 208 at a distance between 0.2D and 0.3D from third set of magnets 214.

As described above, energetic electrons of plasma 220 are confined by first set of magnets 210, second set of magnets 212, and third set of magnets 214, which enables lower operating pressures and thus lower concentrations of neutral species reaching work piece 206. Lower concentrations of neutral species reaching work piece 206 causes less parasitic etching, oxidation, or deposition on the surface of work piece 206 and thus results in higher device yields. In one example, the parasitic deposition or etching on work piece 206 may be less than 2 nm for an ion dose of 1 E14 $cm^{-2}$ to 1 E17 $cm^{-2}$ when process 800 is performed at an operating pressure of less than 0.1 Pa. In another example, an ion uniformity of less than 1% (one sigma variation from the mean) may be achieved using process 800 for an ion dose of 1 E14 $cm^{-2}$ to 1 E17 $cm^{-2}$.

In some cases, process 800 may be performed using plasma-based material modification system 200 having absorber 250. In such cases, absorber 250 may interact with ions flowing from plasma 220 towards support structure 208 and absorb a fraction of the ions. As described above, one region of absorber 250 may have an ion transparency that is different from that of another region of absorber 250. In the present example, the ion transparency of absorber 250 increases from the center to the edge of absorber 250. Thus, ions exiting absorber 250 may have a current density profile that is different from that of ions flowing from plasma 220 to absorber. In particular, ions exiting absorber 250 may have a more uniform current density profile than that of ions flowing from plasma 220 to absorber 250.

Absorber 250 may be positioned between the center of plasma 220 and support structure 208. In cases where plasma-based material modification system 200 includes grids 224, absorber 250 may be positioned either between the center of plasma 220 and third set of magnets 214 or between third set of magnets 214 and grids 224. In other cases where plasma-based material modification system 200 does not have grids 224, absorber 250 may be positioned either between the center of plasma 220 and third set of magnets 214 or between third set of magnets 214 and support structure 208. In some cases, absorber 250 may be positioned no closer than 5 cm from support structure 208.

Unlike grids 224, absorber 250 may be surrounded by plasma from plasma source chamber 202. In cases where absorber 250 is positioned between third set of magnets 214 and support structure 208, plasma from plasma source chamber 202 occupies drift region 226 and thus absorber 250 is surrounded by both ions and electrons of plasma from plasma source chamber 202. In contrast, when grids 224 are biased to extract, accelerate, and focus ion beam 234, regions between adjacent grids are denude of electrons.

Further, process 800 may include applying a bias potential on absorber 250 using a bias voltage source. In one example, absorber 250 may be biased at a DC or RF potential that is different from that of the local plasma potential or local floating potential adjacent to absorber 250. In one such example, absorber 250 may be biased at a suitable potential to attract ions. This increases the rate at which absorber 250 absorbs ions and thus increases the extent at which the current density profile is adjusted through absorber 250. In another such example, absorber 250 may be biased at a suitable potential to repel ions. This may decrease the rate at which absorber 250 absorbs ions and thus may decrease the extent at which the current density profile is adjust through absorber 250. Additionally, the energy at which ions impact absorber 250 would be reduced, which may be advantageous in preventing impurities from being sputtered off absorber 250 and contaminating work piece 206. In yet another example, absorber 250 may have a floating potential where it is electrically isolated from any power source or power sink and thus is allowed to absorb equal current of ions and electrons.

In some cases, absorber 250 may comprised more than one region that may be independently biased. In such cases, process 800 may include applying one or more bias voltages to one or more regions of absorber 250. Each region may be biased dynamically to control the uniformity of the current density of ions treating work piece 206. It should be recognized that absorber 250 may be biased at any time during process 800 to achieve a desired current density profile.

It should be recognized that applying a bias to absorber 250 does not substantially alter the energy of the ions passing through absorber 250. This is due to the presence of plasma surrounding both sides of absorber 250. Thus the average energy of ions exiting absorber 250 is approximately equal to the average energy of ions flowing from plasma 220 to absorber 250. This is in contrast to grids 224 where ions are accelerated and thus the energy of ions change significantly as the ions pass through grids 224.

Further, it should be recognized that absorber 250 may be used in various other plasma-based processing systems to improve the current density profile uniformity of ions treating the work piece. For example, absorber 250 may be used in conventional plasma-based material modification systems, plasma etchers, sputter systems, or plasma enhanced chemical vapor deposition system. Accordingly, process 800 may be performed using various other plasma-based processing systems having an absorber in a similar manner as described above.

Process 800 may include tilting and/or rotating work piece 206 using support structure 208 to improve the uniformity of ion treatment across work piece 206. Tilting of work piece 206 enables ion beam 234 to impact work piece 206 at an angle with respect to the perpendicular of work piece 206 while rotating work piece 206 varies the azimuth to allow all sides of 3D-structures on work piece 206 to be treated with ions. Further, process 800 may include introducing low-energy electrons between grids 224 and work piece 206 using electron source 252 to neutralize the space charge of ion beam 234. Neutralizing the space charge of ion beam 234 is desirable to reduce the spread of ion beam 234 caused by space charge effects.

While specific components, configurations, features, and functions are provided above, it will be appreciated by one of ordinary skill in the art that other variations may be used. Additionally, although a feature may appear to be described in connection with a particular embodiment, one skilled in the art would recognize that various features of the described embodiments may be combined. Moreover, aspects described in connection with an embodiment may stand alone.

Although embodiments have been fully described with reference to the accompanying drawings, it should be noted that various changes and modifications will be apparent to those skilled in the art. Such changes and modifications are to be understood as being included within the scope of the various embodiments as defined by the appended claims.

What is claimed is:

1. A plasma-based material modification system for treating a work piece with ions, the plasma-based material modification system comprising:
    a process chamber;
    a support structure disposed within the process chamber, the support structure configured to support the work piece;
    a plasma source chamber coupled to the process chamber, the plasma source chamber comprising:
        an end wall disposed at a first end of the plasma source chamber;
        at least one sidewall defining a chamber interior between the first end and a second end of the plasma source chamber opposite to the first end;
        a first plurality of magnets disposed on the end wall;
        a second plurality of magnets disposed on the at least one sidewall and surrounding the chamber interior; and
        a third plurality of magnets extending across the chamber interior, wherein the end wall, the at least one sidewall, and the third plurality of magnets define a plasma generation region within the chamber interior, wherein the plasma source chamber is configured to generate a plasma having ions within the plasma generation region, and wherein the third plurality of magnets is configured to confine a majority of electrons of the plasma having energy greater than 10 eV within the plasma generation region while allowing ions from the plasma to pass through the third plurality of magnets into the process chamber for material modification of the work piece; and
    an absorber positioned between a center of the plasma and the support structure, the absorber configured to absorb a portion of ions flowing from the plasma to the absorber, wherein the absorber includes a first region having a first ion transparency and a second region having a second ion transparency that is different from the first ion transparency.

2. The system of claim 1, wherein the first plurality of magnets, the second plurality of magnets, and the third plurality of magnets are configured to generate a plurality of multi-cusp magnetic fields surrounding the plasma generation region, and wherein the plurality of multi-cusp magnetic fields confine a majority of electrons of the plasma having energy greater than 10 eV within the plasma generation region.

3. The system of claim 1, wherein the first plurality of magnets, the second plurality of magnets, and the third plurality of magnets are configured to enable the plasma to be sustained within the plasma generation region at a pressure below 0.1 Pa.

4. The system of claim 1, wherein a magnetic field strength at an inner surface of the end wall and the sidewall is between 0.1 kG and 1 kG.

5. The system of claim 1, wherein the first plurality of magnets and the second plurality of magnets comprise ceramic permanent magnets.

6. The system of claim 1, wherein a width of each magnet of the third plurality of magnets is between 3 mm and 15 mm and a spacing between adjacent magnets of the third plurality of magnets is between 2 cm and 15 cm.

7. The system of claim 1, wherein the third plurality of magnets comprise concentric rings of permanent magnets.

8. The system of claim 1, wherein the third plurality of magnets comprise linear permanent magnets.

9. The system of claim 1, wherein an internal diameter of the plasma source chamber is greater than 45 cm.

10. The system of claim 1, wherein the support structure is configured to position the work piece at a distance of between 0.10D and 0.33D from the third plurality of magnets, wherein D is an internal diameter of the plasma source chamber, and wherein the support structure is configured to apply a bias voltage to the work piece to accelerate ions from the plasma to the work piece.

11. The system of claim 1, further comprising a plurality of grids disposed between the third plurality of magnets and the support structure, wherein the plurality of grids is configured to extract an ion beam comprising ions from the plasma and accelerate the ion beam through the plurality of grids towards the work piece.

12. The system of claim 11, wherein a distance between the third plurality of magnets and the plurality of grids is between 0.10D and 0.33D, and wherein D is an internal diameter of the plasma source chamber.

13. The system of claim 11, wherein the plurality of grids is configured to focus the ion beam as the ion beam passes through the plurality of grids.

14. The system of claim 1, wherein the first region is positioned at a first distance from the center of the absorber, the second region is positioned at a second distance from the center of the absorber, and the first distance is shorter than the second distance.

15. The system of claim 1, wherein the absorber is positioned between the center of the plasma and the third plurality of magnets.

16. The system of claim 1, wherein the absorber includes a plurality of openings and a pattern of ion-absorbing material, and wherein a ratio of a total area occupied by the plurality of openings to a total area occupied by the pattern of ion-absorbing material is greater than 2:1.

17. The system of claim 1, wherein the plasma source chamber has a diameter greater than a diameter of the work piece.

18. A method for material modification of a work piece using a plasma-based material modification system, the plasma-based material modification system comprising a plasma source chamber coupled to a process chamber and a support structure disposed within the process chamber, the support structure configured to support the work piece, the plasma source chamber comprising an end wall disposed at a first end of the plasma source chamber, at least one sidewall defining a chamber interior between the first end and a second end of the plasma source chamber opposite to the first end, a first plurality of magnets disposed on the end wall, a second plurality of magnets disposed on the at least one sidewall and surrounding the chamber interior, and a third plurality of magnets extending across the chamber interior, wherein the end wall, the at least one sidewall, and the third plurality of magnets define a plasma generation region within the chamber interior, and wherein the plasma source chamber is configured to generate plasma having ions within the plasma generation region, the method comprising:

positioning the work piece on the support structure;

generating a plasma of a process gas in the plasma generation region of the plasma source chamber, the plasma comprising ions, neutral species, and electrons, and wherein the first plurality of magnets, the second plurality of magnets, and the third plurality of magnets confines a majority of electrons of the plasma having energy greater than 10 eV within the plasma generation region while allowing ions from the plasma to pass through the third plurality of magnets into the process chamber for material modification of the work piece, wherein the plasma-based material modification system further comprises an absorber positioned between a center of the plasma and the support structure, the absorber configured to absorb a portion of ions flowing from the plasma to the absorber, wherein the absorber includes a first region having a first ion transparency and a second region having a second ion transparency that is different from the first ion transparency; and accelerating ions of the plasma towards the work piece to treat the work piece with ions.

19. The method of claim 18, wherein the work piece receives an ion dose of between 1 E14 $cm^{-2}$ and 1 E17 $cm^{-2}$, and wherein a thickness of material deposited upon or etched from a surface of the work piece while receiving the ion dose is less than 2 nm.

20. The method of claim 18, wherein the plasma is generated at a pressure below 0.1 Pa, and wherein the plasma is sustained at the pressure below 0.1 Pa while treating the work piece.

21. The method of claim 18, wherein an internal diameter of the plasma source chamber is greater than 45 cm.

22. The method of claim 18, wherein the first region is positioned at a first distance from the center of the absorber, the second region is positioned at a second distance from the center of the absorber, and the first distance is shorter than the second distance.

23. The method of claim 18, wherein a current density profile of ions exiting the absorber is different from than a current density profile of ions flowing from the plasma to the absorber.

24. The method of claim 18, wherein a current density profile of ions exiting the absorber is more uniform than a current density profile of ions flowing from the plasma to the absorber.

25. The method of claim 18, further comprising applying one or more bias potentials on the absorber.

26. The method of claim 25, wherein two or more regions of the absorber are independently biased at different potentials.

27. The method of claim 18, wherein plasma from the plasma source chamber surrounds the absorber, and wherein an average energy of ions flowing from the plasma to the absorber is approximately equal to an average energy of ions exiting the absorber.

28. The method of claim 18, wherein ions of the plasma are accelerated towards the work piece by applying a bias voltage to the work piece using a bias power supply.

29. The method of claim 28, wherein the work piece is positioned on the support structure at a distance between 0.10D to 0.33D from the third plurality of magnets, wherein D is an internal diameter of the plasma source chamber.

30. The method of claim 18, wherein the plasma-based material modification system further comprises a plurality of grids positioned between the third plurality of magnets and the support structure, and wherein ions of the plasma are accelerated towards the work piece by applying a bias voltage to at least one grid of the plurality of grids.

31. The method of claim 30, wherein the plurality of grids are positioned between 0.10D to 0.33D from the third plurality of magnets, wherein D is an internal diameter of the plasma source chamber.

32. The method of claim 18, wherein the plasma source chamber has a diameter greater than a diameter of the work piece.

* * * * *